United States Patent [19]
Hanke et al.

[11] Patent Number: 5,008,635
[45] Date of Patent: Apr. 16, 1991

[54] PHASE-LOCK-LOOP LOCK INDICATOR CIRCUIT

[75] Inventors: Carl C. Hanke, Mesa; Carlos D. Obregon, Tempe; Ahmad H. Atriss, Chandler, all of Ariz.

[73] Assignee: Motorola, Inc., Schaumburg, Ill.

[21] Appl. No.: 542,542

[22] Filed: Jun. 25, 1990

[51] Int. Cl.⁵ .............................................. H03L 7/06
[52] U.S. Cl. .............................. 331/1 A; 331/DIG. 2
[58] Field of Search ........................ 331/1 A, DIG. 2

[56] References Cited

U.S. PATENT DOCUMENTS 4,292,916  5/1990  Fukuda ............................... 331/1 A Primary Examiner—Siegfried H. Grimm
Attorney, Agent, or Firm—Michael D. Bingham; Bradley J. Botsch

[57] ABSTRACT

A PLL lock indicator circuit for indicating when a phase-lock-loop circuit is in lock includes a gate circuit coupled to the phase/frequency detector of the phase-lock-loop circuit for providing an output logic signal that is responsive to output logic signals from the phase/frequency detector being in a predetermined state. A counter circuit is enabled by the output logic signal of the gate circuit for providing an output logic signal when the counter circuit has reached a predetermined count. A latch circuit is responsive to the output logic signal of the counter circuit for providing a lock signal at an output terminal of the circuit, the lock signal being indicative of when the PLL circuit is in phase lock.

13 Claims, 2 Drawing Sheets

PHASE-LOCK-LOOP LOCK INDICATOR CIRCUIT

BACKGROUND OF THE INVENTION

This invention relates to phase-lock-loops (PLL) and, in particular, to a circuit for providing a signal to indicate when a phase-lock-loop circuit is in lock.

Phase lock loop circuits are utilized in many applications to provide an output signal that is of the same frequency and phase of an input reference signal. The main components of a PLL circuit comprise a phase/frequency detector, a loop filter, and a voltage controlled oscillator (VCO), as is well known in the art. When in lock, the output signal of the VCO is substantially the same frequency and phase as the input reference signal which is typically applied to an input of the phase/frequency detector. The phase/frequency detector typically has two inputs and two outputs. The two inputs include the input reference signal and the VCO feedback signal while the two outputs provide an UP and a DOWN signal. The phase/frequency detector typically compares the input reference signal to the VCO feedback signal and operates such that if the frequency of the VCO signal is lower than that frequency of the input reference signal, the UP signal of the phase frequency detector goes low thereby indicating that the operating frequency of the VCO must be increased. Furthermore, if the frequency of the VCO signal is at a higher frequency than the input reference signal, the DOWN signal goes low indicating that the operating frequency of the VCO must be decreased. If both the UP and the DOWN signals are at a logic high, then the input reference signal and the VCO feedback signal are substantially equal in frequency and phase and, thus, the phase-lock-loop circuit is in lock.

As the phase-lock-loop circuit is achieving lock on an input reference signal, the VCO feedback signal will overshoot and undershoot the input reference signal before a steady state frequency lock condition is achieved. Therefore, for these temporary frequency lock conditions, which can typically last for several cycles, the UP and the DOWN signals will be a logic high thereby falsely indicating that the phase-lock-loop circuit is in lock.

Further, there typically exists other circuitry that is responsive and becomes activated when the phase-lock-loop circuit of the system is in lock. Therefore, in many applications, it may be essential to knowing when the phase-lock-loop circuit is in lock with a reference signal.

Hence, a need exists for a circuit to indicate when a phase-lock-loop circuit is in lock.

SUMMARY OF THE INVENTION

Accordingly, it is an object of the present invention to provide a circuit to indicate when a phase-lock-loop circuit is in lock.

Another object of the present invention is to provide a phase-lock-loop lock indicator circuit that filters narrow pulse widths occurring at an output of a phase/frequency detector.

In carring out the above and other object of the invention, there is provided a circuit for indicating when a phase-lock-loop circuit is in lock comprising a gate circuit being coupled to the phase-lock-loop circuit for providing an output logic signal responsive to the phase-lock-loop circuit being in lock; a counter circuit responsive to the output logic signal of the gate circuit for providing an output logic signal when the counter circuit has reached a predetermined count; an additional circuit for enabling the counter circuit when the output logic signal of the gate circuit is in a first logic state and disabling the counter circuit when the output logic signal of the gate circuit is in a second logic state; and a latch circuit responsive to the output logic signal of the counter circuit for providing a lock signal at an output terminal of the circuit.

The above and other objects, features and advantages of the present invention will be better understood from the detailed description taken in conjunction with the accompanying drawing.

DETAILED DESCRIPTION OF THE INVENTION

Figure 1:
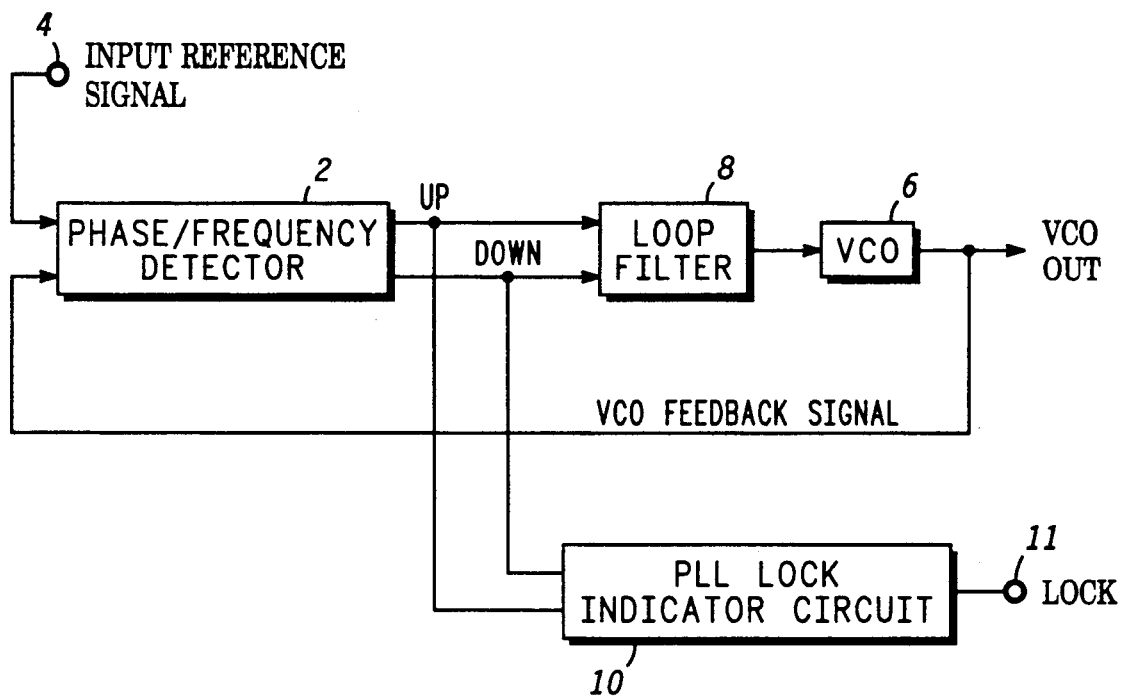
FIG. 1 is a block diagram illustrating a phase-lock-loop including the phase-lock-loop indicator circuit of the present invention.

Referring to FIG. 1, a block diagram illustrating a phase-lock-loop including the phase-lock-loop lock indicator circuit 10 of the present invention is shown comprising phase/frequency detector 2 having a first input coupled to input terminal 4 and a second input coupled to an output of voltage controlled oscillator (VCO) 6. The first output of phase/frequency detector 2 is coupled to a first input of loop filter 8 and to a first input of phase-lock-loop (PLL) lock indicator circuit 10 while the second output of phase/frequency detector 2 is coupled to a second input of loop filter 8 and to a second input of phase-lock-loop (PLL) lock indicator circuit 10. The output of loop filter 8 is coupled to an input of VCO 6 while and output of PLL lock indicator circuit 10 is coupled to output terminal 11. It should be known by one of ordinary skill in the art that the phase-lock-loop circuit comprises phase/frequency detector 2, loop filter 8 and VCO 6.

Briefly, phase/frequency detector 2 compares the input reference signal with the output signal of VCO 6 and provides UP and DOWN output signals. If the VCO output signal is at a lower frequency than the input reference signal, then the UP signal will be in a first logic state thereby increasing the output frequency of the VCO. Likewise, if the VCO output signal is at a higher frequency than the input reference signal, then the DOWN signal will be in a first logic state thereby decreasing the output frequency of the VCO. When both the UP and DOWN signals are in a second logic state, the VCO output signal is substantially the same phase and frequency of the input reference signal. PLL lock indicator circuit 10 is responsive to the UP and DOWN signals being in a second logic state by providing output logic signal LOCK at output terminal 11.

Figure 2:
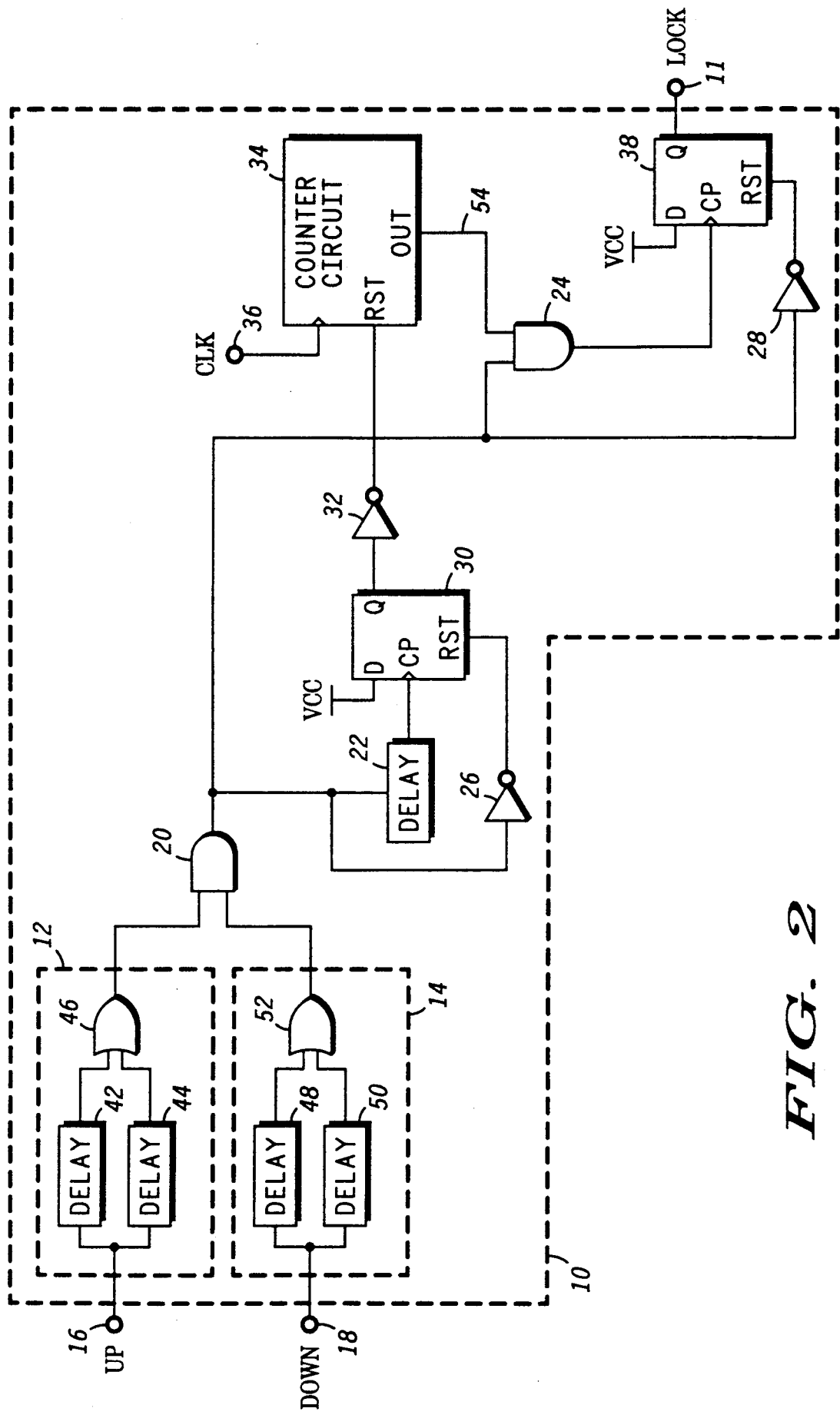
FIG. 2 is a partial schematic diagram illustrating the phase-lock-loop lock indicator circuit of the present invention.

Referring to FIG. 2, the phase-lock-loop lock indicator circuit 10 of the present invention is shown comprising digital filters 12 and 14 having inputs coupled to input terminals 16 and 18, respectively. The outputs of digital filters 12 and 14 are coupled to first and second inputs of AND gate 20, respectively. The output of AND gate 20 is coupled to an input of delay circuit 22, to a first input of AND gate 24, and to inputs of inverters 26 and 28. The output of inverter 26 is coupled to a reset (RST) input of latch circuit 30, the latter having a clock input coupled to the output of delay circuit 22. Latch 30 further has an output (Q) coupled to an input of inverter 32 while the data (D) input of latch 30 is coupled to a first supply voltage terminal at which the operating potential ($V_{CC}$) is applied. The output of inverter 32 is coupled to a reset input of counter circuit 34, the latter having a clock input coupled to input terminal 36. The output of counter circuit 34 is coupled to a second input of AND gate 24, the latter having an output coupled to a clock input of the latch circuit 38. The output of inverter 28 is coupled to a reset input of latch circuit 38, while the data input of latch circuit 38 is coupled to operating potential $V_{CC}$. The output of latch circuit 38 is coupled to output terminal 11.

Digital filter 12 includes delay circuits 42 and 44 having inputs coupled to input terminal 16 and outputs coupled to first and second inputs of OR gate 46. The output of OR gate 46 is coupled to the output of digital filter 12.

Digital filter 14 includes delay circuits 48 and 50 having inputs coupled to input terminal 18 and outputs coupled to first and second inputs of OR gate 52. The output of OR gate 52 is coupled to the output of digital filter 14.

The PLL lock indicator circuit 10 is suitable for integration on a single chip. The output signals of phase/frequency detector 2 are typically applied to input terminals 16 and 18 whereby the UP signal is applied to input terminal 16 and the DOWN signal is applied to input terminal 18. Furthermore, a clock signal is typically applied to input terminal 36 whereby this clock signal would most likely be the lowest frequency clock signal available on the single chip. Finally, output terminal 11 provides an output logic signal (LOCK) which is indicative whether or not the phase-lock-loop circuit is in lock.

In operation, if the frequency of the VCO output signal of the PLL circuit is substantially lower than the frequency of the reference input signal, the UP signal will be in a first logic state, for example a logic low, thereby resulting to speed up the frequency of the VCO output signal. Furthermore, if the frequency of the VCO output signal of the PLL circuit is substantially higher than the frequency of the reference input signal, the DOWN signal will be in a first logic state, for example a logic low, thereby resulting to slow down the frequency of the VCO output signal. Therefore, if both the UP and the DOWN signals are in a second logic state, for example a logic high, the frequency of the VCO output signal is substantially equal to the frequency of the reference input signal and, thus, the PLL circuit is in lock. However, as aforementioned, as a PLL circuit attempts to achieve lock on a reference input signal, the frequency of the VCO output signal will overshoot and undershoot the frequency of the input reference signal before a steady state condition of lock is achieved. As the frequency of the VCO output signal overshoots and undershoots the frequency of the input reference signal, the frequency of the VCO output signal will temporarily be substantially equal to the frequency of the input reference signal. However, it is imperative that LOCK signal at output terminal 11 is only active (indicating lock) when the frequency of the VCO output signal is substantially equal to the frequency of the input reference signal in the steady state condition. This is accomplished by PLL lock indicator circuit 10, as will be described in detail below.

The UP and DOWN signals are passed through digital filters 12 and 14 whose functions will be described in detail later. The outputs of digital filters 12 and 14 are logically ANDed together by AND gate 20. Therefore, if both outputs of digital filters 12 and 14 are a logic high, then the output of AND gate 12 will also be a logic high. However, if one of the outputs of digital filter 12 and 14 are logic low, the output of AND gate 20 will also be a logic low. As aforementioned, a logic low occurring at either the UP or DOWN signal and, consequently, the output of digital filter 12 or 14, indicates that the PLL circuit is not in lock. Therefore, the logic low at the output of AND gate 20 will reset latch circuit 38 via inverter 28 and provide a logic low at output terminal 11 thereby indicating that the PLL circuit is not in lock. In addition, the logic low occurring at the output of AND gate 20 willl reset latch 30 via inverter 26 which in turn will reset counter circuit 34 via inverter 32. Therefore, if either the UP or DOWN signal is a logic low (a non-locked condition), latch circuit 30 and 38 and counter circuit 34 are all reset and LOCK signal is a logic low.

On the other hand, if both the UP and DOWN signals are at a logic high, two possibilities exist. Firstly, the freqency of the VCO crosses over and is temporarily substantially equal to the frequency of the input reference signal. This is not a true lock since the frequency of the VCO output signal is only temporarily locked on to the frequency of the input reference signal and will soon thereafter either rise above or fall below the frequency of the input reference signal. Therefore, for this false lock condition, LOCK signal at output terminal 11 being a logic high is not desired. Secondly, the other possibility is that the frequency of the VCO is substantially equal to the frequency of the input reference signal and is at a steady state condition. Therefore, for this condition, LOCK signal at output terminal 11 being a logic high is desired. If a logic high occurs on both the UP and DOWN signals and, consequently, at the output of AND gate 20, latch circuit 30 will not be reset but will be clocked by the logic high signal occurring at the output of AND gate 20 via delay circuit 22. It should be understood that delay circuit 22 is needed to allow the logic low previously occurring at the output of AND gate 20 to change to a logic high before latch circuit 30 is clocked thereby preventing a race condition between the clock and reset signals. Further, when latch circuit 30 is clocked, the logic high occurring at the D input of latch circuit 30 is transferred to the Q output of latch circuit 30. This logic high occurring at the output of latch circuit 30 will provide a logic low at the reset of counter circuit 34 via inverter 32, thereby enabling counter circuit 34 to begin counting. When counter 34 reaches a predetermined count, output signal 54 of counter circuit 34 will be at a logic high and will be applied to the second of AND gate 24. Further, the logic high occurring at the output of AND gate 20 will be applied to the first input of AND gate 24 which produces a logic high occurring at the output of AND gate 24 as the output of counter 34 goes high. A logic high at the output of AND gate 24 will clock the logic high signal at the D input of latch 38 to the output of latch 38. Therefore, LOCK signal will be a logic high thereby indicating that the PLL circuit is in lock. It is important to realize that if the outputs of digital filters 12 or 14 switch to a logic low before the predetermined count is reached by counter circuit 34, the output of AND gate 20 will be a logic low which will result in resetting latches 30 and 38 and counter circuit 34 thereby providing a logic low at output terminal 11. In summary, if a logic high is present at both outputs of digital filters 12 and 14 for a predetermined amount of time, then LOCK signal will be in a logic high state indicating that the PLL circuit is in lock.

Ideally, where the loop filter of a PLL circuit has zero leakage current and there is no noise on the power supply and ground plane, once the PLL circuit achieves a steady state condition, it will stay locked indefinitely without any additional logic low pulses occurring on the UP or DOWN signals. But in the reality, there is leakage due to the loop filter and there is noise on the power supply and ground plane, so there will be narrow pulses occurring on the UP and DOWN signals to adjust for any drift or variation from a phase lock condition. It should be realized that although these narrow pulses will occur, the PLL circuit is essentially still in lock. Therefore, without a method to filter out the narrow pulses due to the above real world conditions, output terminal 11 will switch to a logic low when the PLL circuit is really still in lock. However, digital filters 12 and 14 provide a circuit for filtering out these narrow pulses as will be described in detail below.

Referring to digital filter 12, delay circuit 42 provides a predetermined amount of delay that will be substantially less than the predetermined amount of delay provided by delay circuit 44. Therefore, if the UP signal goes to a logic low for a short period of time due to drift or variation, the output of delay circuit 42 will provide a logic low to the first input of OR gate 46. However, by the time the logic low signal is passed through delay circuit 44 and applied to the second input of OR gate 46, the UP signal has returned to a logic high and a logic high is now present at the first input of OR gate 46. Therefore, even though the UP signal produced a narrow logic low pulse, the output of OR gate 46 and the output of digital filter 12 never changed from its original logic high level. In summary, if the narrow logic low pulse of the UP signal is not longer than the delay provided by delay circuit 44 (the longer delay), the logic high occurring at the output of digital filter 12 will be preserved. Furthermore, it should be obvious that the delay of delay circuits 42 and 44 can be adjusted to accommodate a wide range of pulse widths corresponding to a wide range of frequencies.

Referring to digital filter 14, the operation of delay circuits 48 and 50 and OR gate 52 is identical to the operation of delay circuits 42 and 44 and OR gate 46, respectively. Therefore, for narrow logic low pulses occurring at the DOWN signal, the output of digital filter 14 will be maintained at a logic high.

By now it should be appreciated from the foregoing discussion that a novel PLL lock indicator circuit has been provided.

What is claimed is:

1. A circuit for indicating when a phase-lock-loop circuit is in lock comprising:
   gate circuit means being coupled to the phase-lock-loop circuit for providing an output logic signal responsive to the phase lock loop circuit being in lock;
   a counter circuit responsive to said output logic signal of said gate circuit means for providing an output logic signal when said counter circuit has reached a predetermined count;
   circuit means for enabling said circuit when said output logic signal of said circuit means is in a first logic state and disabling said counter circuit when said output logic signal of said gate circuit means is in a second logic state; and
   a latch circuit responsive to said output logic signal of said counter circuit for providing a lock signal at an output terminal of the latch circuit.

2. The circuit according to claim 1 further including:
   filter means coupled between the phase-lock-loop circuit and said gate circuit means for filtering pulses produced from the phase-lock-loop circuit.

3. The circuit according to claim 2 wherein said circuit means includes:
   a latch circuit coupled between said gate circuit means and said counter circuit; and
   a delay circuit coupled between said gate circuit means and said latch circuit of said circuit means and responsive to said output logic signal of said gate circuit means for providing a clock signal to said latch circuit of said circuit means.

4. The circuit according to claim 3 further including:
   an additional gate circuit means responsive to said output logic signals of said counter circuit and said gate circuit means for providing a clock signal to said latch circuit, said latch circuit providing said lock signal responsive to said clock signal.

5. The circuit according to claim 4 wherein said filter means includes:
   a first delay circuit having an input coupled to the phase-lock-loop circuit, and an output;
   a second delay circuit having an input coupled to said input of said first delay circuit and an output;
   a first logic gate having respective inputs coupled to said outputs of said first and second delay circuits and having an output coupled to said gate circuit means of the circuit;
   a third delay circuit having an input coupled to the phase-lock-loop, and an output; and
   a fourth delay circuit having an input coupled to said input of said third delay circuit, and an output; and
   a second logic gate having respective inputs coupled to said outputs of said third and fourth delay circuits and having an output coupled to said gate circuit means of the circuit.

6. A circuit for indicating when a phase-lock-loop circuit is in lock, comprising:
   gate circuit means being coupled to the phase-lock-loop circuit for providing an output logic signal;
   a counter circuit responsive to said output logic signal of said gate circuit means for providing an output logic signal when said counter circuit has reached a predetermined count;
   a latch circuit being responsive to said output logic signal of said counter circuit for providing a lock signal at an output terminal of the circuit; and
   filter means coupled between the phase-lock-loop circuit and said gate circuit means for filtering pulses produced from the phase-lock-loop.

7. The circuit according to claim 6 further including:
   an additional latch circuit coupled bewteen said gate circuit means and said counter circuit; and
   an additional gate means responsive to said output logic signals of said counter circuit and said gate circuit means for providing a clock signal to said latch circuit.

8. The circuit according to claim 7 further including:
   a delay circuit coupled between said gate circuit means and said additional latch circuit and responsive to said output logic signal of said gate circuit means for providing a clock signal to said additional latch circuit.

9. The circuit according to claim 8 wherein said filter means includes:
   a first delay circuit having an input coupled to the phase-lock-loop circuit, and an output;
   a second delay circuit having an input coupled to said input of said first delay circuit and an output;
   a first logic gate having respective inputs coupled to said outputs of said first second delay circuits and having an output coupled to said gate circuit means of the circuit;
   a third delay circuit having an input coupled to the phase-lock-loop, and an output; and
   a fourth delay circuit having an input coupled to said input of said third delay circuit, and an output; and
   a second logic gate having respective inputs coupled to said outputs of said third and fourth delay circuits and having an output coupled to said gate circuit means of the circuit.

10. A circuit for indicating when a phase-lock-loop (PLL) circuit is in lock, said PLL circuit including a phase/frequency detector, comprising:
   gate circuit means being coupled to a plurality of outputs of the phase/frequency detector of the phase-lock-loop circuit for providing an output logic signal responsive to output signals appearing at said outputs of said phase/frequency detector being in a predetermined logic state;
   a counter circuit, coupled to said gate circuit means, being responsive to said output logic signal of said gate circuit means for providing an output logic signal at an output thereof when said counter circuit has reached a predetermined count;
   a latch circuit responsive to said output logic signal of said counter circuit for providing a lock signal at an output terminal of the circuit; and
   filter means coupled between said plurality of outputs of the phase/frequency detector of the phase-lock-loop circuit and said gate circuit means for filtering pulses of predetermined widths generated from said phase/frenquency detector.

11. The circuit according to claim 10 further including:
   an additional latch circuit coupled between said gate circuit means and said counter circuit; and
   an additional gate circuit means responsive to said output logic signals of said counter circuit and said gate circuit means for providing a clock signal to said latch circuit.

12. The circuit according to claim 11 further including:
   a delay circuit responsive to said output logic signal of said gate circuit means for providing a clock signal to said additional latch circuit.

13. The circuit according to claim 12 wherein said filter means includes:
   a first delay circuit having an input coupled to a first one of said plurality of outputs of said phase/frequency detector of the phase-lock-loop circuit, and an output;
   a second delay circuit having an input coupled to said input of said first delay circuit and an output;
   a first logic gate coupled to said outputs of said first and second delay circuits and having an output coupled to said gate means of the circuit;
   a third delay circuit having an input coupled to a second one of said plurality of said outputs of said phase/frequency detector of the phase-lock-loop, and an output; and
   a fourth delay circuit having an input coupled to said input of said third delay circuit, and an output; and
   a second logic gate coupled to said outputs of said third and fourth delay circuits and having an output coupled to said gate circuit means of the circuit.

* * * * *